United States Patent [19]

Terui et al.

[11] 4,117,514
[45] Sep. 26, 1978

[54] SOLID STATE IMAGING DEVICE

[75] Inventors: Yasuaki Terui, Neyagawa; Masaru Yoshino, Kobe, both of Japan

[73] Assignee: Matsushita Electric Industrial Co., Ltd., Kadoma, Japan

[21] Appl. No.: 768,190

[22] Filed: Feb. 14, 1977

[51] Int. Cl.² .............. H04N 3/14; H01L 29/78; G11C 19/28; G11C 1/40
[52] U.S. Cl. ................ 358/213; 357/24; 357/30; 307/221 D; 365/183; 365/233; 365/238; 250/211 J
[58] Field of Search ......... 358/213, 59; 357/24, 357/30; 250/211 J, 578; 307/221 C, 221 D; 365/183, 233, 238

[56] References Cited

U.S. PATENT DOCUMENTS

| | | | |
|---|---|---|---|
| 3,715,485 | 2/1973 | Weimer | 358/213 |
| 4,011,402 | 3/1977 | Kioke et al. | 358/213 |
| 4,016,550 | 4/1977 | Weimer | 357/24 X |

OTHER PUBLICATIONS

*A New Self-Scanned Photodiode Array:* Dyck & Weckler, Solid State Technology, Jul. 1971, pp. 37–42.
*Self-Scanned Image Sensors Based on Charge Transfer by the Bucket-Brigade Method:* Weimer, Kovac, Shallcross and Pike, IEEE Transactions on Electron Devices, vol., ed–18, No. 11, Nov. 1971, pp. 996–1003.
*Solid State Imaging Emerges From Charge Transport:* Kovac, Pike, Shallcross and Weimer, Electronics, Feb. 1972.

*Primary Examiner*—Robert L. Griffin
*Assistant Examiner*—Aristotelis M. Psitos
*Attorney, Agent, or Firm*—Stevens, Davis, Miller & Mosher

[57] ABSTRACT

A solid state imaging device capable of converting one-dimensional or two-dimensional optical information into an electrical signal is disclosed. A signal charge stored in each of a plurality of photo-electric converter elements, which is proportional to the amount of incident light, is read into a corresponding stage of a charge transfer device through a switching transistor under the control of a read control pulse. The read control pulse is applied through a clock line of the charge transfer device so that the clock line is used both for read-in and for transfer. In this manner, one picture element of the imaging device is constructed of one photo-cell and two transistors whereby a high integration density of the solid state imaging device is attained.

9 Claims, 11 Drawing Figures

SOLID STATE IMAGING DEVICE

The present invention relates to a solid state imaging device capable of converting one-dimensional or two-dimensional optical information into an electrical signal through a semiconductor device.

A self-scanning device has been known which is capable of converting optical information into an electrical signal and which uses a combination of a photo-sensor and a charge transfer device, e.g. BBD. Such a device is described, for example, in the article "Self-Scanned Image Sensor", IEEE ED-18, No. 11 (1971), by Paulk Weimer. As the photo-sensor, a photo-diode or a photo-transistor is used therein. Another device has been known, in which light is directly radiated onto a charge transfer array such as CCD array to perform the photo-electric conversion with readout taking place in the same array. In this array, however, since the light is directed to the charge transfer array even during the charge transfer, another charge transfer array that is a temporarily storage array consisting of as many storing charge transfer array as the number of sensing charge transfer array must be separately provided in order to avoid optical distortion in the output signal. In this latter device the number of times of transfer of signal charge required to produce the photo-electric converted output is twice that required in the former device. Therefore, this device has a drawback in that the output signal is largely influenced by the transfer efficiency of the charge transfer device.

The present invention relates to the former device which requires a fewer number of times of transfer of signal charge.

The inventors of the present invention have noted a BBD type solid state imaging device which is easy to manufacture, can be two-phase driven, and can be self-scanned without requiring matrix scan, and have investigated this type of device. As an imaging device having a self-scanning feature, a CCD sensor has been proposed, and a frame transfer system in which a transfer device also functions as a sensor has been frequently adopted. The inventors have noted that a plane sensor could be driven at a low clock frequency, e.g., several tens KHz and hence the plane sensor could be constituted by a BBD with a PN junction diode which could be manufactured by a simpler process than and could be driven by a simpler drive circuit than the CCD.

In constructing an image sensor of the interline type using a combination of a photo-diode and a BBD, two lines, that is, a vertical transfer clock line and a transversing control line, would be normally required for each bit to perform the read-in of the optical information and the interlace function.

Bearing the above in mind and using the experience of having developed an audio frequency MOS BBD driven by a low voltage, the inventors have adopted a unique circuit as a basic element in developing the interline type image sensor and developed a high performance image sensor which requires a reduced number of interconnections and elements.

The present invention will become more apparent in the following detailed description taken together with the accompanying drawings, in which.

Figure 1:
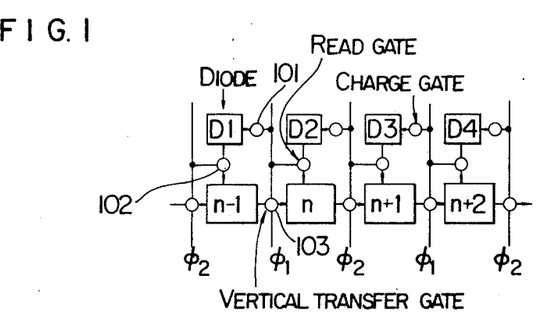
FIG. 1 shows a basic arrangement of a solid state imaging device constructed by a photo-sensor and a charge transfer device.
Figure 2:
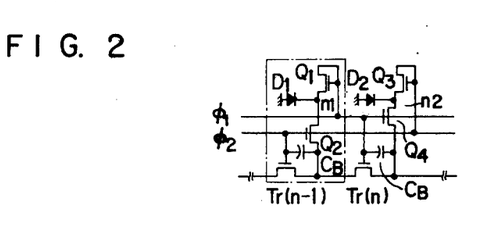
FIG. 2 shows a specific circuit diagram of the basic solid state imaging device constructed by the photo-sensor and the charge transfer device.

FIGS. 1 and 2 show the structures of the solid state imaging device which was proposed by the inventors of the present application in DIGEST OF TECHNICAL PAPERS, pages 40 and 41, IEEE International Solid-State Conference, Feb. 18, 1976. In the proposed image sensor device, the read-in and the transfer of a signal charge have been improved by constructing each cell with three transistors. In FIG. 1, D1 - D4 denote photo-sensors, and $(n-1) - (n-2)$ denote transfer stages forming a series of charge transfer devices. A photo-electric converted signal from the photo-sensor D1 is read into the corresponding charge transfer stage $n-1$ and sequentially transferred through the series of charge transfer devices $n-1$, $n$, $n+1$, $n+2$. Circles in the drawing show gates, in which 101 denotes a gate for charging the photo-sensor, 102 denotes a gate for reading the photo-electric converted signal from the photo-sensor into the charge transfer device, and 103 denotes a gate for transferring a signal from one charge transfer stage to a succeeding stage.

Figure 3:
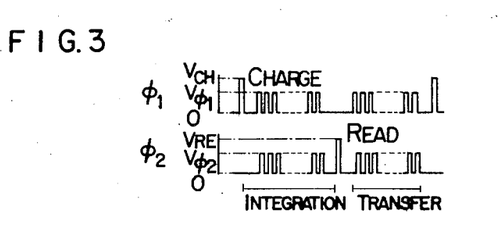
FIG. 3 shows a unique control clock pulse pattern for driving the solid state imaging device shown in FIG. 2.

A feature of the above device is in that the devices are simultaneously recharged by a power supply through the charge gates which are controlled by clock lines of the respective charge transfer stages whereby the numbers of the elements and the interconnections are reduced. The device will now be explained in more detail with reference to FIGS. 2 and 3.

Symbols $\phi_1$ and $\phi_2$ denote transfer clock pulses for controlling the actuation and deactuation of the gates. FIG. 2 shows a specific circuit embodiment therefor. The operation is summarized as follows: As shown in FIG. 2, the control lines for the charge gates $Q_1$ and $Q_3$ and the control lines for the read gates $Q_2$ and $Q_4$ are common to the transfer clock pulses $\phi_1$ and $\phi_2$ for the charge transfer stages, and they are pulsed in a unique drive pulse pattern shown in FIG. 3. In this manner, no separate control line for the charge gates $Q_1$ and $Q_3$ and the read gates $Q_2$ and $Q_4$ is required but only two control lines in total are required. Thus, a high integration density is attained in a two-dimensional arrangement of the photosensor.

In the above construction of the device, however, one photo-diode and three transistors are required per picture element, and the number of transistors required remains as a barrier to the attainment of a high integration density. The inventors have constructed a two-dimensional image sensor of 128 × 128 picture elements, but the demand for higher integration density has been increasing. Furthermore, in the construction of FIG. 2, since the devices are charged at the charge clock (transfer clock) $\phi_1$ and the charge signal is read out at the read clock (transfer clock) $\phi_2$, the storage time of the optical image (which corresponds to one field period in a television system) is restricted to a time interval between the charge clock and the read clock.

One of the reasons why a high integration density of the solid state imaging device of this type is desired is that the dimension of an image area depends primarily on a restriction to a manufacturing and processing technique for a semiconductor device and a restriction to an aperture of a lens used. Hence it is a significant factor in improving the quality of an image reproduced by the device to arrange as large a number of picture elements within the restricted area as possible.

The present invention provides a highly sensitive and high performance self-scanning sold state imaging device using a basic arrangement which allows the reduction of the number of transistors required per picture element of the device to attain a high integration density of the photo-sensor.

According to the present invention, the number of transistors per picture element can be reduced by a novel circuit arrangement and the photosensors arranged in a two-dimensional matrix can be integrated at a high density. As a result, the optical information can be stored over a frame period, the optical sensitivity of the device can be increased by the factor of two, and the circuit forming the picture element can be simplified, resulting in the enhancement in yield and an overall performance of the device.

Figure 4:
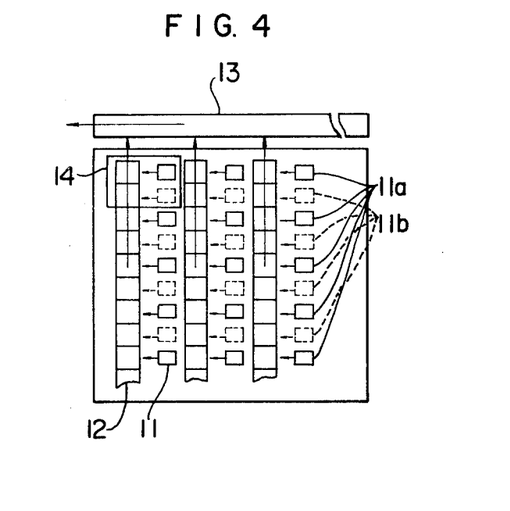
FIG. 4 shows a structure of a solid state imaging device in accordance with one embodiment of the present invention.

FIG. 4 shows the structure of one embodiment of a solid state imaging device of the present invention.

A photo-sensor 11 has a photo-electric conversion function and shown as a reverse biased photo-diode. The photo-diode is exposed to an incident light for a given integration (storage) time period and then discharges stored charge in accordance with the amount of incident light. When it is desired to produce output signals from the device at a standard television rate, the integration time period corresponds to one field or frame scan period of a standard television scan. Hereinafter, one frame scan period is referred to as the integration time period. A vertical signal transferring BBD (Bucket Brigade Device) 12 reads in signal charges which have been photo-electric converted by the photosensors 11 as shown by solid lines into corresponding positions of the BBD stages during a first field period and then sequentially transfers them to a parallel-to-serial conversion output circuit 13 a line at a time. The parallel-to-serial conversion output circuit 13 for producing time-serial video output signals may be an analog shift register using BBD or CCD, or a combination circuit of a conventional digital shift register and switching gates.

In the following second field period, signal charges in photo-sensors 11b shown by dotted lines are read into corresponding positions of the BBD stages and then they are sequentially transferred to the parallel-to-serial-conversion output circuit 13 a line at a time. In this manner, an interlace scan is carried out for each field period.

A block 14 surrounded by a solid rectangle in FIG. 4 is a principal portion of the present invention and a specific configuration of that portion is explained below.

Figure 5:
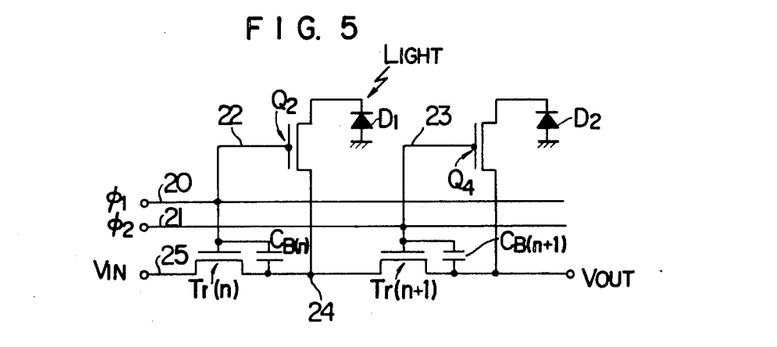
FIG. 5 shows a first embodiment of a major section of the solid state imaging device of the present invention and illustrates a combination circuit of a photo-sensor and a charge transfer device.

FIG. 5 shows an equivalent circuit of photo-diodes and BBD constructed by MOS transistors in accordance with a specific arrangement of the present invention. In FIG. 5, $Tr(n)$ and $Tr(n+1)$ denote transistors forming a vertical signal transferring BBD, and $C_B(n)$ and $C_B(n+1)$ denote bucket capacitances forming charge transfer stages. $D_1$ and $D_4$ denote photo-diodes for photo-electric conversion, and $Q_2$ and $Q_4$ denote transistors for reading the photoelectric converted signals of the photo-diodes into the charge transfer stages. To drive the line of charge transfer devices, two-phase clock pulses $\phi_1$ and $\phi_2$ are supplied to clock lines 20 and 21 of the transistors $T_r(n)$ and $T_r(n+1)$ forming the line of charge transfer devices. Control lines 22 and 23 of the transistors $Q_2$ and $Q_4$ for reading in the photo-electric converted signals from the photo-diodes $D_1$ and $D_2$ are connected in common with the charge transferring clock lines 20 and 21, respectively.

The operation of the photo-sensors and the vertical signal transferring BBD shown in the equivalent circuit of FIG. 5 is explained with reference to FIG. 6.

Figure 6:
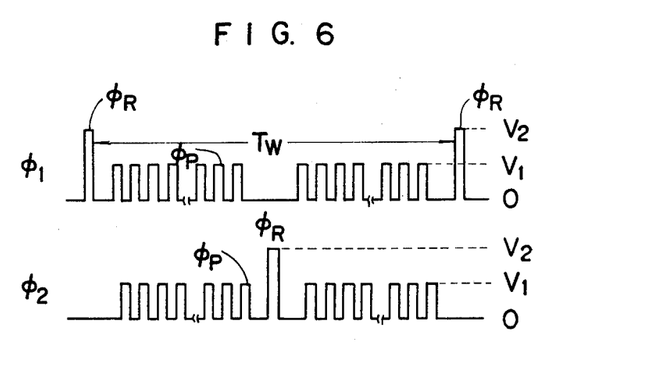
FIG. 6 shows a control clock pulse pattern for driving the first embodiment of the present invention.

FIG. 6 shows an example of pulse pattern for the clock pulses $\phi_1$ and $\phi_2$ for driving the circuit shown in FIG. 5. In the illustrated example of the clock pulse pattern, a sequence of clock pulses $\phi_p$ (which occur at 15.75 KHz in a standard television scan) for driving the vertical signal transferring BBD at a clock pulse voltage $V_1$ is combined with a sequence of control pulses $\phi_R$ for reading the photo-electric converted signals from the photo-diodes into the vertical signal transferring BBD at a clock pulse voltage $V_2$. It is normally necessary to meet a relation of $V_2 > V_1$. It has been proved by an experiment that a proper operation is attained by the combination of $D_2 = 12V$ and $V_1 = 6V$, or $V_2 = 15V$ and $V_1 = 8V$.

When the control pulse $\phi_R$ (of the voltage $V_2$) is applied to a gate terminal of the transistor $Q_2$ in FIG. 5, the transistor $Q_2$ for reading in the photo-electric converted signal is turned on, and the photo-diode $D_1$ is reset to a given voltage $V_{R2}$ which corresponds to the voltage $V_2$ of the control pulse $\phi_R$. (Normally, $V_{R2}$ is equal to $V_2 - V_T$, where $V_T$ is a threshold voltage of the MOS transistor $Q_2$.) After the control pulse $\phi_R$ terminates, the photo-diode $D_1$ remains to be reset at $V_{R2}$ while the transistor $Q_2$ is turned off and floats. Under this condition, the photo-diode $D_1$ is exposed to light for a given time period so that a photo-electric leak current flows from the photo-diode $D_1$ toward a semiconductor substrate (GND) resulting in a voltage drop of $\Delta V$ in the photo-diode. The magnitude $\Delta V$ is proportional to the amount of incident light to the photo-diode.

When the control pulse $\phi_R$ is again applied to the gate terminal of the transistor $Q_2$ while the diode voltage is being reduced by $\Delta V$, the circuit operates as follows: A drain terminal 24 of the read transistor $Q_2$ is connected in common with a drain terminal of the transistor $T_r(n)$ of the charge transfer stage and it is capacitively coupled to a gate terminal of the transistor $T_r(n)$. As a result, the drain terminal 24 is pulled up to a high positive potential. Since the charge transfer is normally carried out during the light exposure period by the signal charge transfer clock pulse $\phi_p$ while a voltage near $V_1$ is being applied to an input terminal 25 of the vertical signal transferring BBD, the drain terminal 24 has been reset to the given voltage $V_{R1}$ corresponding to the voltage $V_1$ (usually, $V_{R1}$ is equal to $V_1 - V_T$, where $V_T$ is a threshold voltage of the MOS transistor $T_r(n+1)$ before the control pulse $\phi_R$ is applied. Accordingly, when the control pulse $\phi_R$ is applied to the gate terminal of the transistor $Q_2$, the voltage at the drain terminal 24 is pulled up to $(V_{R1} + V_2)$ and the charges are exchanged between the drain terminal 24 and the photo-diode $D_1$. Namely, because the potential of the photo-diode has been decreased to $(V_{R2} - \Delta V)$ by the light exposure, a current flows from the drain terminal to the photo-diode. As a result, the potential at the drain terminal decreases by approximately $\Delta V$ assuming that the bucket capacitance is substantially equal to the capacitance of the photodiode $D_1$ to the semiconductor substrate. The amount of charge corresponding to the voltage $\Delta V$ is proportional to the total amount of charge flowing into the semiconductor substrate by the photo-diode $D_1$ through the light exposure for a given time period.

When the control pulse $\phi_R$ terminates, the potential at the drain terminal 24 of the charge transfer stage, that is, the voltage across the bucket capacitance $C_B$, assumes $(V_{R1} - \Delta V)$ so that the photo-electric converted signal can be read into the vertical signal transferring BBD by the application of the control pulse $\phi_R$. At the same time, by the application of the control pulse $\phi_R$, the voltage of the photo-diode $D_1$ is again reset to the given voltage $V_{R2}$ and thus it is ready for sensing next optical information. In this manner, precharging of the diode from the transferring BBD can be carried out by the application of the control pulse $\phi_R$. A transfer efficiency of the BBD was 99.95% and precharging was carried out without causing a disturbing voltage variation.

The photo-electric converted signals read into the vertical signal transferring BBD are sequentially transferred to the parallel-to-serial conversion output circuit 13 by a sequence of clock pulses $\phi_p$ of the pulse voltage $V_1$ which drive the BBD.

In the illustrated embodiment of the present invention, a maximum allowable photo-electric converted signal $\Delta V$ max is equal to $V_2 - V_1$. Within the above range, the voltage of the photo-diode is always higher than $V_1$ so that the voltage of the photo-diode does not affect the transfer signal.

While the previous explanation referred only to the case where the control pulse $\phi_R$ is applied to the gate terminal of the transistor $Q_2$, both clock pulses $\phi_1$ and $\phi_2$ may be used as shown in FIG. 6, in which case the clock pulse $\phi_R$ is applied to the gate terminal of the transistor $Q_4$ to enable the interlaced scan of the photo-electric converted signals of the photo-diodes arranged in a matrix.

In FIG. 6, $T_w$ represents an integration time period during which the optical information is stored in the photo-diodes. In the illustrated embodiment, it corresponds to one frame period in a standard television scan and it may be 1/30 seconds, for example.

The series of operations described above are carried out simultaneously on a plurality of photo-diodes and a plurality of vertical signal transferring BBD's forming the solid state imaging device.

Figure 7:
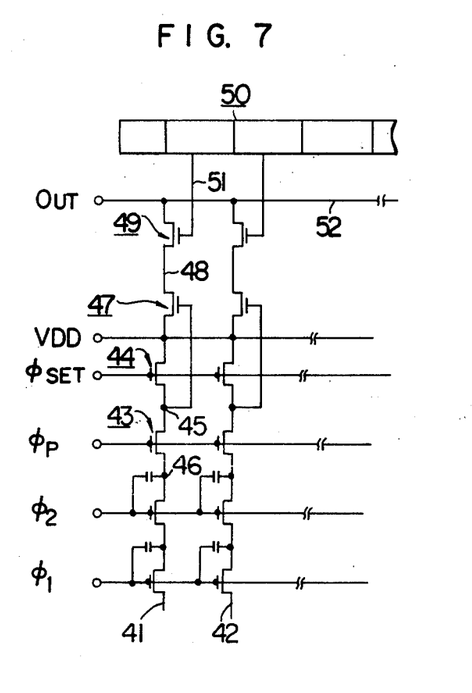
FIG. 7 shows an embodiment of an output and support circuit of the solid state imaging device of the present invention.

An embodiment of the parallel-to-serial conversion output circuit 13 is now explained. FIG. 7 shows a configuration of the parallel-to-serial conversion output signal. Numerals 41 and 42 denote final stages of the vertical signal transferring BBD. The photo-diode circuit of the final stage is omitted in the drawing for the purpose of simplification. The photo-electric converted signal at a terminal 46 of the final stage of the vertical signal transferring BBD is transferred to a node 45 by a timing gate comprising a transistor 43 and the control line $\phi_p$. The node 45 is coupled to a gate terminal of a parallel output transistor 47, a conductance of which is modulated by the photo-electric converted signal. A transistor 44 serves to recharge the voltage at the node 45 to a given voltage by a power supply line VDD and a control line $\phi_{set}$ before the photo-electric converted signal is fed to the node 45 by the timing gate.

The power supply line VDD also functions as a power supply line to the parallel output transistor 47. The photo-electric converted signal at an output node 48 of the parallel output transistor 47 is transferred to a video output line 52 by an output line 51 of a conventional digital shift register 50 and a parallel-to-serial conversion transistor 49. The digital shift register 50 produces a video output at, for example, 7.3 MHz. The explanation of the circuit of the digital shift register is omitted for the purpose of simplification. An output signal from the digital shift register 50 is applied to one of the gate terminals of a plurality of parallel-to-serial conversion transistors as represented by the gate terminal of the parallel-to-serial conversion transistor 49. The output signal from the digital shift register 50 should be large enough to sequentially turn on the parallel-to-serial conversion transistors. With the arrangements described above, the photo-electric converted signals of the plurality of vertical signal transferring BBD's can be converted into the time-serial signal on the video output line 52.

Figure 8:
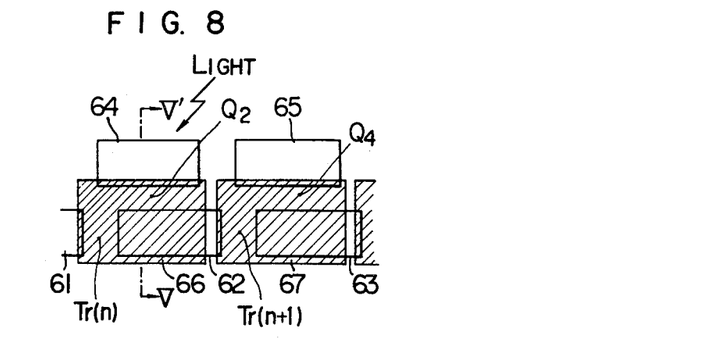
FIG. 8 shows a plan structure of the first embodiment when formed on a semiconductor substrate.

FIG. 8 shows a plain structure of the circuit arrangement of FIG. 5 when formed on a semiconductor substrate. In FIG. 8, numerals 61, 62 and 63 denote diffusion regions of opposite conductivity type to the semiconductor substrate, which form the transistors $T_r(n)$ and $T_r(n+1)$, and numerals 64 and 65 denote diffusion regions of opposite conductivity type to the semiconductor substrate, which act as photo-diodes to sense a light. Numerals 66 and 67 denote gate electrodes to which the clock control signals $\phi_1$ and $\phi_2$ are supplied. The transistors $T_r(n)$ and $T_r(n+1)$ and the transistors $Q_2$ and $Q_4$ shown in FIG. 5 are formed in FIG. 8 at the respectively indicated locations between the diffused regions.

Figure 9:
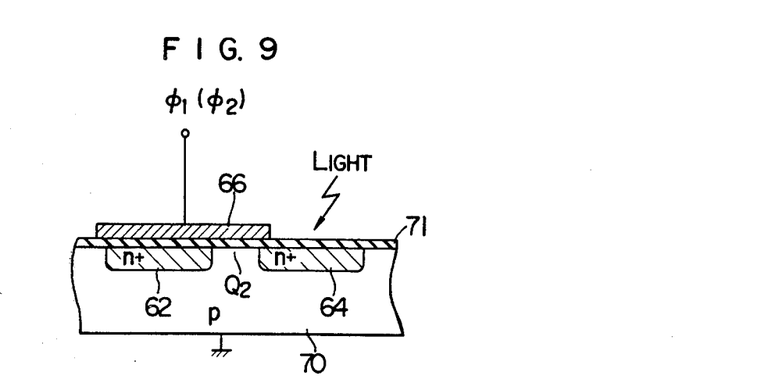
FIG. 9 shows a sectional structure of the first embodiment when formed on the semiconductor substrate.

FIG. 9 shows a sectional view taken along a chain line V—V' in the plain structure shown in FIG. 8. In FIG. 9, numeral 70 denotes a P-type semiconductor substrate, and numeral 62 denotes an N-type diffusion region which forms a source or drain region of the charge transfer stage. An N-type diffusion region 64 represents a photo-diode, and numeral 66 denotes a gate electrode to which the control clock pulses $\phi_1$ and $\phi_2$ shown in FIG. 6 are applied. Numeral 71 denotes a gate oxide layer of the MOS transistor. A conduction channel $Q_2$ in FIG. 9 corresponds to the transistor $Q_2$ in FIG. 5 by which the photo-electric converted signal from the photo-diode is read into the drain region 62.

In an actual operating condition of the structure shown in FIGs. 8 and 9, a light shielding mask is disposed such that only the photo-diodes are exposed to the light, but such mask is omitted in the drawings for the purpose of simplification.

As seen from FIGS. 5, 6, 7, 8 and 9, according to the preferred embodiments of the present invention, the control lines for the MOS transistors $Q_2$ and $Q_4$ for reading the photo-electric converted signal from the photo-diode into the charge transfer device are shared with the clock lines for the charge transfer device and a control pulse is additionally provided for the clock lines. In this manner, the recharging of the diode can be accomplished simultaneously with the read-in of the photo-electric converted signal by the switching MOS transistor. Accordingly, the device shown in FIG. 5 can be operated with two clock control lines and one picture element (sensor) can be constructed by one diode and two transistors. Thus, the structure is greatly simplified and a high integration density of the photo-sensors arranged in a matrix is attained. The inventors have constructed a two-dimensional image sensor of 400 × 320 picture elements using the structure of the present invenion.

Figure 10:
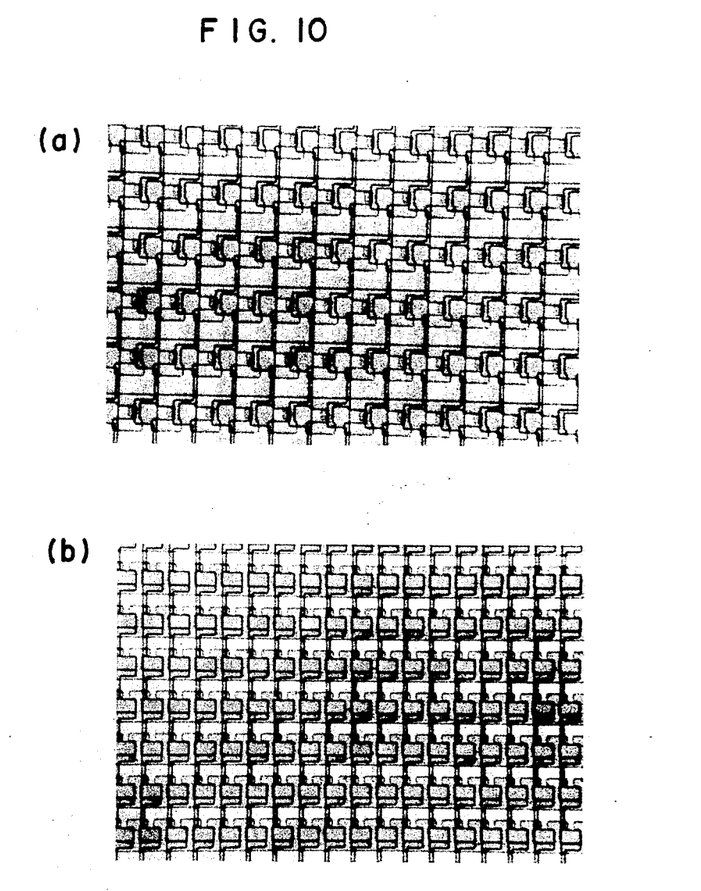
FIG. 10(a) shows a pattern of a portion of a semiconductor chip of the device shown in FIG. 2.
FIG. 10(b) shows a pattern of a portion of a semiconductor chip of the device shown in FIG. 5.

FIG. 10(a) shows a photograph of a portion of a surface pattern of an image sensor (of 128 × 128 picture elements) constructed in accordance with the basic arrangement shown in FIG. 2, and FIG. 10(b) shows a similar picture of an image sensor (having image area of 7.2 mm × 14 mm and one picture element area of 22.5 $\mu$m × 35 $\mu$m) of 400 × 320 picture elements constructed in accordance with the present invention. The photograph of FIG. 10(b) was taken for the same area as FIG. 10(a) at the same magnification scale (250 magnifications). It is seen from the comparison of FIGS. 10(a) and 10(b) that the present invention allows a higher integration density and reduces the area per picture element to one half or less.

Furthermore, according to the present invention, the storage time of the photo-electric conversion can be extended from one field period shown in FIG. 2 (e.g. 1/60 seconds in a standard television scan) to $T_w$ or one frame period shown in FIG. 6 (e.g. 1/30 seconds) and hence the sensitivity of the device can be improved by the factor of two.

As described hereinabove, the present invention provides a two-dimensional image sensor which has a high sensitivity, can be manufactured at a high integration density and can be readily driven. Thus, the present invention has a great contribution to a color solid state imaging device.

What is claimed is:

1. A solid state imaging device for converting an optical image to an electrical signal comprising:
   photo-electric conversion means including a plurality of photo-sensors for accumulating charge signals corresponding to said optical image for a given time period;
   first and second clock lines supplying phased clock signals, each clock line supplying a train of clock signals and control pulses, said train of clock signals having a predetermined period and being produced periodically, said control pulses also being produced periodically in a period in which no clock signals are produced and having a greater amplitude than that of said clock signals;
   charge transfer means including a plurality of charge transfer elements each associated with corresponding ones of said plurality of photo-sensors; and
   a plurality of switching elements each connected between corresponding ones of said associated photo-sensors and charge transfer elements, said plurality of switching elements and charge transfer elements having control inputs which are connected alternately to said first and second clock lines, each of said switching elements being adapted to be turned on when said control pulses are applied to thereby read said charge signals into corresponding charge transfer elements, said charge transfer means being adapted to transfer said read-in charge signals to an output circuit in response to said clock signals.

2. A solid state imaging device according to claim 1 wherein said charge transfer means comrpises BBD's.

3. A solid state imaging device according to claim 1 wherein said photo-sensors comprise photo-diodes built in a semiconductor substrate, and said plurality of switching elements comprise switching transistors built in said semiconductor substrate and having gate electrodes thereof connected alternately to said first and second clock lines.

4. A solid state imaging device according to claim 3 wherein said transistors are MOS transistors.

5. A solid state imaging device according to claim 1, wherein
   said photo-sensing means comprises a photo diode having an anode connected to a semiconductor substrate,
   said charge transfer means comprises a transistor of the BBD type having a bucket capacitance formed between a gate and a drain,
   said switching means comprises an MOS transistor having a source connected to a cathode of said photo diode and having a drain connected in common with the drain of said BBD type transistor, and
   said clock line means comprises a gate electrode common to said MOS transistor and said BBD type transistor.

6. A solid state imaging device for converting a two-dimensional optical image to a sequential electric signal to provide a video singal comprising:
   photo-electric conversion means including a matrix array of photo-sensors for accumulating charge signals corresponding to said optical image for a given time period;
   vertical transfer means including a plurality of lines of vertical transfer devices respectively associated with columns of photo-sensors in said matrix array, each line of vertical transfer devices including a plurality of charge transfer elements respectively associated with the plurality of photo-sensors contained in said column;
   a plurality of pairs of clock lines each pair supplying two phased clock signals, each clock line supplying a series of vertical transfer clock signals produced periodically and during a predetermined period and supplying a control pulse inserted between two successive series of vertical transfer clock signals, said control pulse having an amplitude larger than that of said vertical transfer clock signals; and
   switching means including a plurality of lines of switching transistors, each switching transistor in each line of switching transistors being connected between one set of mutually associated photo-sensors and charge transfer elements, each line of switching transistors having the gate electrodes of the switching transistors alternately connected to the clock lines of one of said pairs of clock lines,
   said switching transistors being responsive to control pulses applied to said gate electrodes via said clock lines to render said associated photo-sensors maintained at a constant voltage for a predetermined time period and to simultaneously cause the charge signals accumulated on said associated photo-sensors to be read into corresponding charge transfer elements of said plurality of lines of vertical transfer devices, said charge transfer elements of said plurality of lines of vertical transfer devices being responsive to a said series of clock signals following a said control pulse to sequentially transfer said charge signals read into said charge transfer elements of said plurality of lines of vertical transfer devices a line at a time; and parallel-to-serial conversion means receiving the line at a time sequentially transferred charge signals for further transferring said charge signals from said plurality of lines of vertical transfer devices to an output means in response to a horizontal transfer clock signal occurring during an output period to produce a time sequential video signal.

7. A solid state imaging device according to claim 6 wherein said vertical transfer means comprises two-phase driven BBD's and the gate electrodes of said switching means are alternately connected to two-phase clock lines.

8. A solid state imaging device according to claim 6 wherein said control pulses are applied to respective ones of said clock lines for each frame period with the control pulses being offset by one field with respect to each other.

9. A solid state imaging device for converting an optical image to an electrical signal comprising:

a photo-sensing means for accumulating a charge signal corresponding to the optical image for a given time period;

a charge transfer means connected to said photo-sensing means;

a switching means connected between said photo-sensing means and said charge transfer means; and a clock line means connected to the control electrodes of said switching means and said charge transfer means for applying a control pulse and a clock signal to said switching means and said charge transfer means, said control pulse being followed by said clock signal and having a greater amplitude than said clock signal, said switching means being turned on in response to said control pulse to read the charge signal from said photo-sensing means into said charge transfer means, and said charge transfer means being responsive to said clock signal to transfer the charge signal to an output circuit means.

* * * * *